(12) United States Patent
Peters et al.

(10) Patent No.: US 11,696,578 B2
(45) Date of Patent: Jul. 11, 2023

(54) CONTROL OF HARMFUL ORGANISMS ON THE BASIS OF THE PREDICTION OF INFESTATION RISKS

(71) Applicant: BASF Agro Trademarks GmbH, Ludwighafen am Rhein (DE)

(72) Inventors: Ole Peters, Düsseldorf (DE); Holger Hoffmann, Haan (DE); Karoline Epke, Münster (DE)

(73) Assignee: BASF Agro Trademarks GmbH, Ludwigshafen am Rhein (DE)

( * ) Notice: Subject to any disclaimer, the term of this patent is extended or adjusted under 35 U.S.C. 154(b) by 1173 days.

(21) Appl. No.: 16/327,065

(22) PCT Filed: Aug. 17, 2017

(86) PCT No.: PCT/EP2017/070877
§ 371 (c)(1),
(2) Date: Feb. 21, 2019

(87) PCT Pub. No.: WO2018/036909
PCT Pub. Date: Mar. 1, 2018

(65) Prior Publication Data
US 2019/0174739 A1  Jun. 13, 2019

(30) Foreign Application Priority Data
Aug. 24, 2016  (EP) .................................. 16185503

(51) Int. Cl.
*G06F 7/00* (2006.01)
*A01M 7/00* (2006.01)
*A01N 25/00* (2006.01)
*A01M 21/04* (2006.01)
*G06F 30/20* (2020.01)
*G06N 7/01* (2023.01)

(52) U.S. Cl.
CPC ........ *A01M 7/0089* (2013.01); *A01M 21/043* (2013.01); *A01N 25/00* (2013.01); *G06F 30/20* (2020.01); *G06N 7/01* (2023.01)

(58) Field of Classification Search
CPC ... A01M 7/0089; A01M 21/043; A01N 25/00; G06F 30/20; G06N 7/005
USPC ..................................... 700/28–29; 703/2, 6
See application file for complete search history.

(56) References Cited

U.S. PATENT DOCUMENTS

| | | | |
|---|---|---|---|
| 6,199,000 B1 | 3/2001 | Keller et al. | |
| 2009/0132132 A1 | 5/2009 | Peterson et al. | |
| 2012/0112883 A1* | 5/2012 | Wallace | G16H 50/80 340/10.1 |

FOREIGN PATENT DOCUMENTS

| | | |
|---|---|---|
| GB | 2447681 A | 9/2008 |
| WO | WO-0023937 A1 | 4/2000 |
| WO | WO-0197097 A1 | 12/2001 |

OTHER PUBLICATIONS

Hoffmann, H., et al., "Impact of Spatial Soil and Climate Input Data Aggregation on Regional Yield Simulations", PLOS ONE—Research Article, 2016, pp. 1-23.

(Continued)

*Primary Examiner* — Yolanda R Cumbess
(74) *Attorney, Agent, or Firm* — Lowenstein Sandler LLP

(57) ABSTRACT

The present invention relates to the control of harmful organisms which may appear during the cultivation of crop plants. The control is effected on the basis of the prediction of subarea-specific infestation risks.

15 Claims, 1 Drawing Sheet

(56) References Cited

OTHER PUBLICATIONS

Moran, M.S., et al., "Opportunities and Limitations for Image-Based Remote Sensing in Precision Crop Management", Remote Sens. Environ., 1997, vol. 61, pp. 319-346.
Parry, H.R. et al., "Having your cake and eating it: A modeling framework to combine process-based population dynamics and dispersal simulation", 19th International Congress on Modeling and Sumulation, 2011, pp. 2535-2541.
Savary, S., et al., "Modeling and mapping potential epidemics of wheat diseases—examples on leaf rust and Septoria tritici blotch using EPIWHEAT", Eur. J. Plant Pathol., 2015, vol. 142, pp. 771-790.
Willocquet, L., et al., "Simulating multiple pest damage in varying winter wheat production situations", ScienceDirect—Field Crops Research, 2008, vol. 107, pp. 12-28.
Wilson, B.J. et al., "Long-term stability of distribution of Alopecurus rnyosuroides Huds. within cereal fields", Weed Research, 1991, vol. 31, pp. 367-373.
International Search Report for PCT/EP2017/070877 dated Sep. 26, 2017.
Written Opinion of the International Searching Authority for PCT/EP2017/070877 dated Sep. 26, 2017.

* cited by examiner

Diagrams

CONTROL OF HARMFUL ORGANISMS ON THE BASIS OF THE PREDICTION OF INFESTATION RISKS

CROSS-REFERENCE TO RELATED APPLICATIONS

This application is a national stage application (under 35 U.S.C. § 371) of PCT/EP2017/070877, filed Aug. 17, 2017, which claims benefit of European Application No. 16185503.6, filed Aug. 24, 2016, both of which are incorporated herein by reference in their entirety.

BACKGROUND OF THE INVENTION

The present invention relates to the control of harmful organisms which can occur in the cultivation of crop plants. The control is effected on the basis of the prediction of subarea-specific infestation risks.

Current predictive models of the risk of a pest or disease infestation are often based on weather data at the field level or coarser spatial resolution.

The decision support system proPlant Expert (Newe et al. 2003, Johnen et al. 2010; www.proPlantexpert.com) uses data on the crop (development stage, growth conditions, plant protection measures), on the weather (temperature, duration of insolation, wind speed, precipitation) and on pests/diseases (economic threshold values, pest/disease pressure). With the aid of this data, a field-specific infestation risk is estimated and a recommendation issued as to the timing of treatment, plant protection agents and an assessment of previous plant protection measures.

Depending on the disease or the pest, in particular the current disease/pest pressure can be considered by inspection in the field, the crop rotation, the distance to a field with the same crop in the previous year and the infestation in the previous year. The estimation of the risk can be made differently here depending on the disease or the pest. Thus the underlying model can for example take into account development cycles or the migration of pests (Johnen et al. 2010). In general, this system is rule-based or heuristic in combination with process-based calculations (e.g. estimation of the leaf wetness). The treatment recommendations on the time of treatment and plant protection agents thus created are field-specific, but not subarea specific.

Further decision support systems are known (Knight & Mumford 1994, Knight 1997). As well as such decision support systems, which in some cases comprises the modelling of a large number of pests or disease, there are in the literature a large number of models on the development of individual diseases or pests (Peterson & Higley 2001). These models can be rule- or process-based and also be purely statistical or data-supported/empirical. Further, these models can be generic and with adaptation of the model parameters can be used again for several diseases or pests, e.g. EPIWHEAT (Savary 2015) or WHEATPEST (Willocquet 2008).

In general, with the aid, of pure disease or pest infestation models, a risk of an infestation (e.g. proPlant Expert) can be estimated, while with the aid of plant-disease or plant-pest coupled models, the influence of disease or pest on the development of the crop plants including yield can also be estimated (e.g. WHEATPEST, Willocquet 2008).

The said decision support systems and models are as a rule so-called point models. In these, the models are as a rule calibrated such that the output reflects the spatial representation of the input. If the input is acquired at one point in the space or is interpolated or estimated for one point in the space, then it is as a rule assumed that the model output is valid for the whole adjacent field. An application of so-called point models calibrated at the field level to further, as a rule coarser scales is known (Hoffmann et al., 2016). An application of this so-called point model to several points within one field during this enables a subarea-specific modelling of the infestation. In this, however, spatial dependences or dispersal vectors of an infestation are neglected.

On the other hand, systems also exist for the spatially explicit modelling of diseases and pests. These models explicitly simulate the chronological-spatial dispersal of diseases or pests. In these, spatial dependences and dispersal vectors of an infestation are taken into account. One example is the combination of the systems APSIM (process-based simulation) and DYMEX (spatial modelling in 2d), (Parry et al., 2011).

In decision support systems (see above), predictive models are predominantly used in order to estimate the timing of an infestation and to take appropriate eradicative or curative plant protection measures.

Approaches to the subarea-specific or variable application of pesticides are based on the currently observed biomass or leaf area, wherein as a rule with increasing biomass or leaf area more plant protection agent (PPA) is used. The greater application here can be achieved by a higher concentration of the active substance at the nozzle (mg/L) with equal application and also by a higher application (L) at equal concentration of the active substance. These approaches consider neither the local risk due to diseases or pests nor the actual local disease/pest infestation.

Current methods estimate the general disease or pest pressure of a field with the aid of 1) scouting in the field, 2) sampling and analysis methods (e.g. counting of spores, genetic analysis in the laboratory to identify and/or quantify the fungus), 3) information on the disease or pest risk factors in the previous year (e.g. distance to the field of the same crop in the previous year, or from the nonspecific normalized and differenced vegetation index (NDVI, or also: "Normalized Density Vegetation Index") stress maps from the previous year) and 4) information on the actual severity of disease or pest infestation in the previous year.

The current practicable methods are thus spatially differentiated little or not at all. Further, they do not take account of long-term vectors. In particular, a combination of spatially high resolution plant protection (risk prediction, application) taking account of such long-term vectors is not known. Thus however, constant or long-term environmental factors (soil, field edge growth with shrubs, location, exposure) can lead to constant spatial disease or pest gradients or other spatial differences (subareas). A spatially differentiated application is desirable here in order 1) to control the current infestation efficiently and as needed (in case of fungal infestation often also curatively, before the pathogen becomes visible),
2) optionally to weaken biotic vectors long-term (e.g. pests with change of host, weed patches).

SUMMARY OF THE INVENTION

This problem is solved by the subjects of the independent claims 1, 11, 12, 13, 14 and 15. Preferred embodiments are to be found in the dependent claims and in the following description.

A first subject of the present invention is thus a method for the control of harmful organisms in a field in which crop plants are grown, wherein the method comprises the following steps:
(A) creation of a first infestation map, wherein in the first infestation map subareas in the field are indicated in which in a previous cultivation period an infestation with harmful organisms had been observed and/or
(B) Creation of a second infestation map, wherein in the second infestation map subareas in the field are indicated in which an infestation with harmful organisms has been observed in the current cultivation period,
and
(C) subarea-specific prediction of the infestation risk to the crop plants with harmful organisms for the current cultivation period, wherein the prediction is made
on the basis of the first infestation map and/or on the basis of the second infestation map,
and
based on subarea-specific information on the state of development of the crop plants and/or on the basis of subarea-specific environmental factors,
and
on the basis of weather information,
and
(D) creation of a treatment map, wherein in the treatment map it is stated which subareas of the field are to be treated, in order to prevent the dispersal of harmful organisms and/or to control harmful organisms, wherein the treatment map
is created on the basis of the prediction of the infestation risk for the current cultivation period, and optionally
is created and/or adapted on the basis of the conditions predicted for the time of the planned treatment with regard to weather, and/or development state of the crop plant and/or environmental factors,
and
(E) optionally: treatment of subareas of the field in accordance with the treatment map.

A further subject of the present invention is a system for the control of harmful organisms in a field in which crop plants are grown, comprising
(A) a first infestation map, wherein in the first infestation map subareas in the field are indicated in which an infestation with harmful organisms has been observed in a past cultivation period, and/or
(B) a second infestation map, wherein in the second infestation map subareas in the field are indicated in which an infestation with harmful organisms has been observed in the current cultivation period,
and
(C) means for the prediction of the infestation risk to the crop plants with harmful organisms for the current cultivation period, wherein the prediction is made
on the basis of the first infestation map and/or on the basis of the second infestation map,
and
based on subarea-specific information on the state of development of the crop plants and/or on the basis of subarea-specific environmental factors,
and
on the basis of weather information,
and
(D) means for the creation of a treatment map, wherein in the treatment map it is stated which subareas of the field are to be treated, in order to prevent the dispersal of harmful organisms and/or to control harmful organisms, wherein the treatment map is created
on the basis of the prediction of the infestation risk for the current cultivation period, and optionally
is created and/or adapted, on the basis of the conditions predicted for the time of the planned treatment with regard to weather, and/or development state of the crop plant and/or environmental factors
and
(E) optionally: means for the treatment of subareas of the field in accordance with the treatment map.

A further subject of the present invention is a computer program product comprising:
a computer-readable data storage device, and
program code which is stored on the data storage device, and which when run on a computer causes the computer to read a digital infestation map into the working memory of the computer, wherein in the digital infestation map subareas in the field are indicated in which an infestation with harmful organisms has been observed in a past and/or in the current cultivation period, and
program code which is stored on the data storage device, and which when run on a computer causes the computer to calculate subarea-specific risks for the infestation of the crop plants with harmful organisms for the current cultivation period, wherein the calculation is made on the basis of the following information:
the digital infestation map(s),
and
subarea-specific information on the state of development of the crop plants and/or subarea-specific environmental factors,
and
weather information,
program code which is stored on the data storage device, and which when run on a computer causes the computer to create a digital treatment map and output it in digital form to a user, wherein in the treatment map it is stated which subareas of the field are to be treated, in order to prevent the dispersal of harmful organisms and/or to control harmful organisms, wherein the treatment map is created on the basis of the prediction of the subarea-specific infestation risks for the current cultivation period, and optionally is created and/or adapted on the basis of the conditions predicted for the time of the planned treatment with regard to weather, and/or development state of the crop plant and/or environmental factors.

A further subject of the present invention is a preferably digital treatment map, wherein in the treatment map it is stated which subareas of a field for the cultivation of a crop plant are to be treated with a plant protection agent, in order to prevent the dispersal of harmful organisms and/or to control harmful organisms, wherein the treatment map has been created on the basis of the subarea-specific prediction of the infestation risk of the field with one or more harmful organisms for the current cultivation period, and optionally has been created and/or adapted on the basis of the conditions predicted for the time of the planned treatment with regard to weather, and/or development state of the crop plant and/or environmental factors.

A further subject of the present invention is a system comprising the treatment map according to the invention and a mobile application device, wherein the application device comprises means for applying one or more plant protection agents, a positioning system and a computer, wherein the computer is configured so that the computer can read the treatment map into a working memory of the computer and actuate the means for applying one or more plant protection agents, so that plant protection agent is applied when the application device is located at a location for which location it is stated in the treatment map that plant protection agent is to be applied there.

A further subject of the present invention is use of the treatment map according to the invention for the subarea-specific application of plant protection agents.

DETAILED DESCRIPTION OF THE INVENTION

Figure 1:
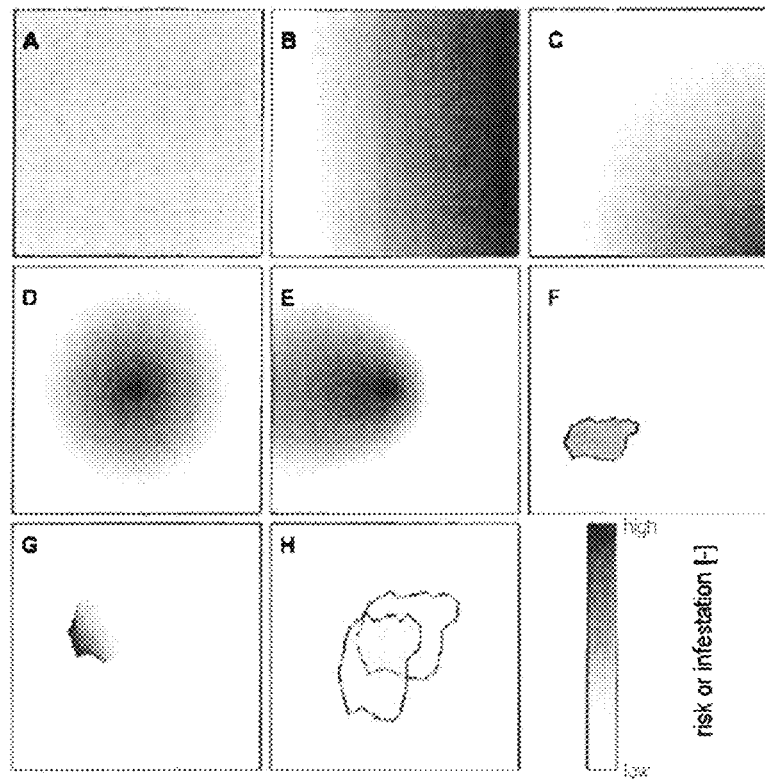
FIG. 1: Illustration of selected examples of risk or infestation factors of diseases or pests of various spatial intensity on the field.

The invention is explained in more detail below, without differentiating between the subjects of the invention (method, systems, computer program product, treatment map, use). The following explanations are rather intended to apply analogously for all subjects of the invention, irrespective of in what context (method, systems, computer program product, treatment map, use) they are effected.

Steps (C) and (D) of the method according to the invention are obligatory. Step (E) is optional and, of steps (A) and (B), one step ((A) or (B)) is obligatory and the other optional. This accordingly results in the following embodiments: (A), (C), (D)/(A), (C), (D), (E)/(B), (C), (D)/(B), (C), (D), (E)/(A), (B), (C), (D)/(A), (B), (C), (D), (E). The same applies to the system according to the invention.

In step (A) of the method according to the invention, a first infestation map is created. In the first infestation map, places are indicated on the field at which harmful organisms have been observed in the past.

Below, a "harmful organism" is understood to mean an organism which can appear during cultivation of crop plants and harm the crop plant, adversely influence the harvest of the crop plant or compete with the crop plant for natural resources. Examples of such harmful organisms are weeds, grassy weeds, animal pests such as for example beetles, caterpillars and worms, fungi and pathogens (e.g. bacteria and viruses). Even if from the biological point of view viruses are not included among the organisms, they should nonetheless fall within the term "harmful organism" here.

The term "weed" (plural: weeds) is understood to mean plants of the spontaneous herbaceous vegetation (segetal flora) in plant crops, grassland or gardens, which are not being deliberately cultivated there and develop for example from the seed potential of the soil or via inward flight. The term is not limited to herbaceous plants in the strict sense, but also includes grasses, ferns, mosses or woody plants.

In the plant protection field, the term "grassy weed" (plural: grassy weeds) is often also used in order to emphasize a distinction from the herbaceous plants. In the present text, the term weed is used as the generic term, which is intended also to cover the term grassy weed, unless reference is being made to specific weeds or grassy weeds.

Accordingly, in the present invention grassy weeds and weeds are plants which appear as incidental growth during the cultivation of a desired crop plant. Since they compete with the crop plant for resources, they are undesired and should therefore be controlled.

The term "field" is understood to mean a spatially definable area of the earth's surface which is utilized agriculturally in that crop plants are planted on such a field, supplied with nutrients and harvested.

The term "crop plant" is understood to mean a plant which through the intervention of man is purposefully cultivated as a useful or ornamental plant.

The infestation map is preferably a digital map. The term "digital" means that the map can be processed by a machine, as a rule a computer system. "Processing" is understood to mean the known processes for electronic data processing (EDP).

Methods for the creation of digital maps on which places are indicated at which harmful organisms have appeared are described for example in GB2447681A, U.S. Pat. No. 6,199, 000, US 2009/0132132A1 and WO00/23937.

Preferably, the harmful organisms were observed in the cultivation period which directly preceded the current cultivation period. In many cases, the cultivation period is one year, so that the infestation map is usually created on the basis of the pest infestation observed in the previous year. It is however also possible to allow information about cultivation periods (years) lying further back in time to influence the creation of the first infestation map.

In particular, the use of such information is advantageous if patches of harmful organisms have been observed in the field over a period of more than one cultivation period.

The term "patch" is understood to mean a subarea of a field on which a certain harmful organism is repeatedly observed.

One example is the meadow foxtail grass (*Alopecurus myosuroides* Huds), which exhibits seed dispersal close to the parent plant (Wilson & Brain, 1991). Here, the weed patches are stable or recurring; however, new ones can also appear. Further examples are Orobranche crenate Forsk in broad beans (Oveisi et al. 2010), *Galium aparine, Viola arvensis* Murr., *Chenopodium album* L. and *Polygonum aviculare* L. (see review by Gerhards R (2010)).

A further example is infestation with nematodes which displays a spatially stable pattern (Campos-Herrera et al. 2011, Godefroid et al. 2013, Ortiz et al. 2010).

A "spatially stable pattern" designates a repeatedly observable or measurable spatial distribution or grouping of patches in a field. Further, a spatially stable pattern of diseases and pests can relate to i) the cause of a disease or pest infestations, ii) to the disease or the pest infestation itself and also iii) to an intensity feature of a disease or a pest infestation. For example, a pest W can transmit a virus X, which leads to a disease Y with the symptom Z. It is possible that W, X, Y and Z are measureable and each show a stable pattern.

In particular, these patterns can be caused by an interaction of the development cycle of the pathogen or pest with further abiotic factors. The invention is therefore also to be applied to regions in the field which because of their constitution display a generally higher disease or pest pressure. Examples of such constitutional factors are position or exposure, depressions, soil or field edge constitution (e.g. hedges).

As an example, *Septoria* leaf spot may be mentioned, which appears under favourable conditions for infection by fungal spores of *Septoria Tritici*. Now these favourable conditions can result from higher humidity or lower air replacement, due to exposure, local depressions and/or soil type.

An example of a pest with which recurrent patterns arise is the *brassica* pod midge (*Dasineura brassicae*) in rape. Because of its poor flight capability, the distance from the winter host is critical for an infestation. A recurrent pattern appears here as a result of the position of the field relative to that of the winter host and also to that of the field with rape cultivation in the previous year.

A further example are pathogens whose infestation pressure is determined by the degradation rate of plant residues in the soil. Stable patches can be caused here by local differences in the soil.

The present invention is thus preferably to be applied to the infestation with harmful organisms with which patches or infestation gradients are observed in the field. If in the past an infestation has been observed at a point in the field, there is a certain probability that an infestation will again appear at this point.

The invention is however also to be applied to the infestation with harmful organisms with which no patches are observed. In such a case, the first infestation map is enlisted in order to determine the factors which have in the past led to an observed infestation. In the process, it is determined which conditions have prevailed at the infestation sites, namely both before the infestation and also during the infestation. By drawing on general knowledge about the harmful organisms and their dispersal, correlations can then be derived which can be used for the prediction of an infestation risk.

The first infestation map is used in order to predict the risk of a (renewed) infestation in the current cultivation period.

In step (C) a prediction is made of the risk that harmful organisms will arise in the field in the current cultivation period (infestation risk).

The term "infestation risk" is understood to mean the probability of the occurrence of a disease, a pest or corresponding damage or symptoms on the crop plant and also the probability of the occurrence of other technical detriments arising from an infestation.

Here in each case the risk is based on one manifestation of the disease, the pest or on corresponding damage or symptoms on the plant and also on other technical detriments arising therefrom.

This risk is calculated. For this, preferably a model of the dispersal of the harmful organisms which are indicated in the first infestation map is preferably created.

Optionally, information about an infestation of the crop plants with harmful organisms in the current cultivation period can also influence the prediction. For this, in a preferred embodiment of the present invention a second infestation map is created (step (B)). In the second infestation map, places on the field at which harmful organisms have been observed in the current cultivation period are indicated.

The first and the second infestation map can be based on observations by one person (as a rule the farmer) or on data which was created via sensors, or on both.

Observations which are based on sensors are for example remote sensing data. Remote sensing data are digital information which has been obtained from the Earth's surface from a distance, for example by satellites. The use of aircraft (unmanned (drones) or manned) for collecting remote sensing data is also possible.

By means of appropriate remote sensors, either the harmful organisms themselves (e.g. weeds and grassy weeds) or their effects on the crop plants are observed (M. S. Moran et al.: Opportunities and Limitations for Image-Based Remote Sensing in Precision Crop Management, Remote Sensing of Environment (1997) 61: 319-346).

Sensors in the field or sensors which are mounted on machines for working the agricultural area (agricultural machinery) can also be used for the observation of harmful organisms.

It is also possible firstly to calculate the infestation risk on the basis of the first infestation map. If subareas are thereby identified in which a high infestation risk currently exists, measures can be taken to conform or deny a current infestation. It is for example possible that on the basis of the prediction of a currently high infestation risk a farmer receives a computer-supported notification that he should check the subareas for a possible infestation. The checking can obviously take place by means of remote sensors, sensors in the field, or sensors on an agricultural machine. These observations are then the basis for the second infestation map. If an acute infestation is identified or even not identified, these observations as a second infestation map influence the further (updated) prediction of the infestation risk.

Naturally it is also possible, to create further infestation maps (a third, a fourth, . . . ) in the course of the current cultivation period and to allow them to influence the prediction. It is also possible continuously to monitor the infestation with harmful organisms by means of suitable sensors and to allow the corresponding information to influence the (continuously updated) prediction.

For all infestation maps, it holds true that the observation that no harmful organisms have been observed in a subarea can also be valuable information which can influence the prediction of the infestation risk.

Preferably in addition, information on the state of development of the crop plants also influences the prediction of the infestation risk. Depending on the existing state of development, crop plants are more or less susceptible to an infestation with a harmful organism and/or harmful organisms only appear at all in the presence of a certain state of development.

The information on the state of development of the crop plants for example includes the following information: development stage (e.g. BBCH code), growth height, leaf size, leaf shape, leaf colour, leaf area, sowing date, variety, biomass present, nutritional state and health status.

The BBCH code (or also BBCH scale) gives information on the morphological development stage of a plant. The abbreviation officially stands for the "Biologische Bundesanstalt, Bundessortenamt and CHemische Industrie". The BBCH scale is used in the scientific communication the problems of plant development and the optimal or recommended use time for fertilizing and plant protection measures in the cultivation of useful plants.

The information on the state of development of the crop plants can also be gathered by means of remote sensors and/or sensors in the field and/or human observation and/or sensors on agricultural machinery.

The prediction of the infestation risk is preferably further influenced by information on subarea-specific environmental factors.

A component of the environment which is in interaction with other components (e.g. living organisms) is described as an "environmental factor". Environmental factors can also be described as ecological factors or ecofactors.

Mostly, the environmental factor is understood as a description of an environmental influence on an organism. This can benefit or harm the living organism.

The environmental factors can be biotic or abiotic. Biotic factors are factors of the living environment, such as for example nutrition, competitors, enemies, parasites and pathogens. Abiotic factors are states of the environment which are not caused or influenced by living organisms.

For the prediction, those environmental factors which can exert an influence on the dispersal of the observed harmful organisms are taken into consideration.

Preferred environmental factors are: soil type, soil condition, soil composition, soil humidity, crop rotation, nutrient content in the soil, field edge vegetation, exposure to insolation, wind and/or precipitation conditions, the vegetation of neighbouring fields and the climate.

Further, information on the weather preferably influences the prediction of the infestation risk. The dispersal of many harmful organisms (in particular fungi and animal pests) depends, in particular on the development of the weather during the crop plant cultivation period under consideration. Here, both the weather of the recent days and weeks, months and years (past), and also the current weather (the present), and also the expected weather (future) can be critical for the occurrence and the dispersal of harmful organisms. Thus information on the weather which influences the prediction of the infestation risk includes measured weather data for the current cultivation period, inter- or extrapolated weather data and predicted weather data.

All information which influences the prediction of the infestation risk has preferably a positional resolution which is higher than the field under consideration, in order to enable a subarea-specific prediction. The higher the positional resolution is, the smaller are the subareas for which a specific prediction can be made.

The model for the prediction of the infestation risk can on the one hand be a purely rule-based expert system, which outputs the infestation risk for currently observed situations on the basis of past observations. On the other hand, the prediction model can also be mechanistic or process-based. As a rule, the prediction model will be a mixture of rule-based and process-based system. Thus for example, the leaf wetness can be process-based, and the infection risk resulting therefrom can be estimated on a rule basis. Further, purely data-driven prediction models are possible, for example on the basis of neuronal networks. In principle, a combination of the model systems described above is possible.

Preferably, the infestation risk is simulated on a rule or process basis, if a reproduction of the simulated processes (e.g. error analysis) is desired, the understanding of the simulated processes is available in the form of corresponding equations, the quality of the model results is superior to a purely data-driven model approach or the data basis obtained is low.

On the other hand, a purely data-supported approach (e.g. deep learning) can preferably be used if a reproduction of the simulated processes (e.g. error analysis) is unimportant, the understanding of the simulated processes in the form of corresponding equations is lacking, the quality of the model results is superior to a process- or rule-based model approach, or the data basis obtained is high. Depending on the model, the computing power to be used can also be decisive for the selection of a modelling approach.

In a first development step, an extension of a decision support system such as for example proPlant (see above) can be used for the risk estimation. In a second development step, process-based or coupled models can be used for this.

The following parameters preferably influence the modelling:
a) Weather: daily precipitation totals, insolation totals, daily minimum and maximum air temperature and temperature close to the ground, and soil temperature, wind speed, etc.
b) Soil: soil type, soil texture, soil nature, field capacity, permanent wilting point, organic carbon, inorganic nitrogen content, compactness, Van Genuchten parameter, etc.
c) Crop plant: species, variety, variety-specific parameters such as for example specific leaf area index, temperature sums, maximal root depth, etc.
d) Cultivation measures: seed, sowing time, sowing density, sowing depth, fertilizer(s), quantity of fertilizer(s), number of fertilizer application dates, fertilizer application date, soil cultivation, harvesting date, harvest residues, plant protection dates, plant protection agents (nature and quantity/concentration applied), crop rotation, distance from field with same crop in previous year, irrigation, etc.
e) Remote sensing: acquisition of leaf area or biomass via remote sensing products (e.g. NDVI), acquisition of nutritional state, acquisition of diseases, acquisition of the effectiveness of plant protection measures, etc.
f) Infestation: scouting parameters for estimating the current infestation pressure or epicentre of the disease, scouting parameters for acquisition of the actual infestation (e.g. previous year infestation), laboratory values for classification and/or quantification of the harmful pathogens present, etc.
g) Geography: geographical position, exposure, orography, height, etc.

The prediction is made subarea-specifically (see for example FIG. 1), i.e., the field is divided into subareas for each of which the infestation risk is calculated.

The division of the field into subareas here can be effected such that the field is divided into a defined number of equal-sized or almost equal-sized subareas.

Preferably the division of the field into subareas is effected taking account of the spatial distribution of those factors which exert the greatest influence on the dispersal of the harmful organisms.

It may be assumed that the soil condition has a decisive influence on the dispersal. In this case it can be useful to select the subareas such that regions in the field with similar soil condition are compiled into one subarea, while regions in the field which differ markedly in soil condition are separated into different subareas.

The result of step (C) of the method according to the invention is a digital map of the field, in which a risk for infestation with one or more harmful organisms is stated for individual subareas. The statement of the infestation risk is preferably made in the form of a percentage probability. If in the current cultivation period e.g. in the context of the creation of the second infestation map an infestation with harmful organisms has been observed in some subareas, then the infestation risk for these subareas is 100%. If on the other hand currently no infestation is yet observable, the infestation risk is lower than 100%.

Instead of the percentage probability of an infestation or in addition thereto, the infestation risk can also be shown in colour on the digital map. For example, those areas for which a comparatively low infestation risk has been determined (e.g. less than 20%) can be coloured green, while subareas for which a comparatively high infestation risk has been determined (e.g. greater than 80%) can be coloured red, Preferably, the infestation risk is determined and shown as a function of time. This enables the user (e.g. farmer) to recognize when a elevated risk is to be expected. Preferably the prediction is updated continuously, in particular while taking account of the current weather development.

In step (D) of the method according to the invention, a subarea-specific treatment map is created on the basis of the subarea-specific prediction.

"Treatment" is understood to mean those measures which result in a prevention of the occurrence or the dispersal of harmful organisms and/or the reduction of the quantity of harmful organisms present. The treatment measures can relate to the crop plants, the environment of the crop plants (e.g. the soil) or the harmful organisms. Particularly when the measures relate to harmful organisms which are present, the term control is also used here. The term "control" thus designates a prevention of the dispersal or reduction of the quantity of harmful organisms present. In the case of the weeds/grassy weeds, the term "quantity" for example relates to the biomass which is present in the form of weeds/grassy weeds. The term "quantity" can however, particularly in case of a disease, also be understood to mean the quantity of crop plants which is already showing disease symptoms.

As a rule the treatment is effected by the application of one or more plant protection agents.

The term "plant protection agent" is understood to mean an agent with which harmful organisms can be effectively controlled and/or their dispersal prevented. A plant protection agent is usually a formulation which contains one or more active substances against one or more harmful organisms. If the harmful organisms are for example weeds or grassy weeds, then the active substance for control of the weeds or grassy weeds is a herbicide and the plant protection agent a herbicide formulation. If the harmful organism is for example a fungus, then the active substance for control of the fungus is a fungicide and the plant protection agent a fungicide formulation. As synonymous to the term "plant protection agent", the term "control agent" is also used here.

Also possible is an application of growth regulators instead of or in combination with plant protection agents, if this is beneficial to the cultivation method and lowers the infestation risk at the field level or subarea-specifically. Thus growth regulators should here also fall within the term plant protection agent and a treatment of a subarea should here also include the application of a growth regulator on the subarea.

The control of harmful organisms with appropriate plant protection agents on a chemical and/or biological basis can also be augmented or replaced by physical/mechanical control methods.

Physical removal (or also mechanical removal) is understood to mean that for example the weed/grassy weed as a harmful organism is either completely removed, or parts thereof are removed, so that the weed/grassy weed is no longer viable and dies off. In contrast to the control of the weed/grassy weed with a herbicide, which can be described as chemical control, in the physical/mechanical control no chemical or biological agent is applied. Hence the physical/mechanical control also exerts no selection pressure on the weeds/grassy weeds, but is often more laborious and more costly than the application of herbicides.

An irrigation should also for example be understood as physical/mechanical control, with which for example weeds are deliberately brought to germination, in order then specifically to eliminate them. Flaming off the harmful organisms should also be understood as physical/mechanical control.

It is for example possible to use chemical and physical methods in alternation.

It is also possible that one part of an area is treated chemically, and another part physically.

Also possible however is a combined modification in one operation, e.g. if the use of chemicals is restricted because of legal regulations or a combination of harmful organisms is present with which a combined control with mechanical and chemical means has the best prospects of success. The combined use of physical and chemical methods can also be useful if the combination exerts a synergistic effect.

In the treatment map it is stated on which subareas measures should be taken in order to prevent the infestation with harmful organisms, to prevent the dispersal of existing harmful organisms or to reduce the quantity of existing harmful organisms.

If the treatment comprises the application of one or more plant protection agents, then the term "application map" is also used together with or instead of the term "treatment map".

In the application map, it is stated onto which subareas of the field, what quantities of one or more selected plant protection agents should be applied in order to prevent the dispersal of harmful organisms and/or to control harmful organisms.

Preferably, the treatment map and the application map are digital maps.

It is possible that a treatment should take place everywhere where harmful organisms have been observed during the current cultivation period.

Likewise it is possible to specify a treatment in the treatment map only for those subareas in which the observed harmful organisms have exceeded a damage threshold.

"Damage threshold" is a term from agriculture, forestry and horticulture. It states the density of infestation with pests, diseases or overgrowth with weeds, beyond which control is economically useful. Up to this value, the additional economic cost due to control is greater than the loss of harvest to be feared. If the infestation or weed overgrowth exceeds this value, the costs of control are at least compensated by the increased yield to be expected.

Depending on the nature of a pest or a disease, the damage threshold can differ very greatly. With pests or diseases which can only be controlled with high expenditure and with adverse secondary effects on further production, the damage threshold can be very high. However, if a minor infestation can already become a major dispersal centre which threatens to destroy the entire production, the damage threshold can be very low.

In the prior art, there are many examples of the determination of damage thresholds (see for example Claus M. Brodersen: lnformationen in Schadschwellenmodellen, Berichte der GIL [Information in Damage Threshold Models, GIL Reports] Vol. 7, pages 26 to 36, http://www.gil-net.de/Publikationen/7_26.pdf).

In many cases it is necessary to control harmful organisms preventatively. This means that subareas in which a high risk of infestation with a harmful organism has been determined are included in the application map as "subareas to be treated with one or more plant protection agents", even if currently no infestation is recorded. In such a case it is better from the economic and/or ecological point of view not to allow an infestation to occur at all than to wait until the infestation is acute, in order then to control it.

Accordingly, in one embodiment of the present invention, in the application map subareas for which an infestation risk threshold has been exceeded are specified as "subareas to be treated with one or more plant protection agents".

In a preferred embodiment, the infestation risk threshold is determined analogously to the damage thresholds. Preferably in this, the infestation risk of a subarea is set equal to the area fraction of the subarea which is affected by a hundred percent infestation. This may be illustrated in an example.

Let us assume that for a subarea of size 1 ha an infestation risk of 30% has been determined. For the calculation of the infestation risk threshold, the 30% infestation risk is converted into the theoretical case that 30% of subarea (1 ha·30%=0.3 ha) is infested with the harmful organism and the remainder (70%, corresponds to an area of 1 ha·70%=0.7 ha) is not infested. As costs for the treatment, the costs for the treatment of the whole area are taken (and not only the infested fraction of 30%). It is now determined beyond what infestation risk it is from the economical point of view more beneficial to undertake a treatment of the whole respective subarea than to have to give up the theoretically infested fraction.

In the application map it is stated which subareas are to be treated. It is preferably also stated with which plant protection agent/plant protection agents the particular subareas are to be treated.

In the simplest case, the application map is a so-called "on/off map" in which it is merely stated at which sites one or more plant protection agents should be used.

Preferably, the quantity of the particular plant protection agent to be used is stated. In many cases, with increasing biomass or leaf area of the crop plants being grown, more plant protection agent is used. The additional cost in this can arise through a higher concentration of the active substance in the plant protection agent, through a greater quantity of plant protection agent or through both measures. In a preferred embodiment, the quantity of the plant protection agent and also the concentration of the active substance is stated for the subareas to be treated.

In the application map, the treatment of subareas of the field is specified for a time-point in the future. Preferably therefore, the values of those factors which have an influence on the efficacy of the plant protection agent/agents predicted for the application time-point also influence the application map Thus it is for example possible that the temperature and/or the soil moisture and/or the development state of the crop plant have an influence on the efficacy. It is for example possible that an active substance is more rapidly degraded at a higher temperature and a higher soil moisture than at a lower temperature and a lower soil moisture. Thus it can be that, under corresponding conditions an increased quantity of active substance is necessary in order to achieve a desired effect. Accordingly, the conditions for the application time-point are predicted and the quantity of the plant protection agent and/or concentration of the active substance in the plant protection agent is adapted to these conditions.

It is also possible that the prevailing conditions are predicted for different time-points in the future, in order then to decide which time-point is the most favourable time-point for an application. If for example at a first time-point conditions are present which necessitate an greater quantity of plant protection agent than the conditions which are present at a second time-point, it may be that it is economically more favourable to effect the application at the second time-point.

In a further preferred embodiment, the quantity of the plant protection agent and/or the concentration of the active substance in the plant protection agent is specified depending on the infestation risk. If the infestation risk for a first subarea is higher than for a second subarea, then more plant protection agent and/or a plant protection agent of higher active substance concentration is applied onto the first subarea than onto the second subarea.

The selection of the plant protection agent is preferably made on the basis of all the harmful organisms to be controlled. This means that for each single harmful organism which is to be controlled a control agent specifically suitable for that harmful organism is not obligatorily selected. Rather, plant protection agents are selected which are best suited for the combination of harmful organisms present.

This may be illustrated on the basis of the following examples, in which two weeds (weed 1 and weed 2) occur on the same subarea of a field.

Example 1: weed 1 and weed 2 are sensitive to herbicide 1→herbicide 1 is applied.

Example 2: weed 1 is sensitive to herbicide 1 and weed 2 is sensitive to herbicide 2 and no usable herbicide is known which acts both against weed 1 and also against weed 2→herbicide 1 and herbicide 2 are applied.

Example 3: weed 1 is sensitive to herbicide 1 and weed 2 is sensitive to herbicide 2 and a usable herbicide 3 is known which acts against weed 1 and also weed 2→either herbicide 3 alone or herbicide 1 in combination with herbicide 2 are applied. The choice is preferably made on the basis of the more effective control.

For example, in the control of the grassy weed meadow foxtail, the following control agents are used: in the autumn application beyond BBCH stage 11, a sulphonyl mixture consisting of the active substances mesosulfuron and iodosulfuron (preferably plus safener) is used. On change of active substance, propoxycarbazone or pyroxsulam and florasulam are then used. If in the spring the grassy weed repeatedly exceeds the damage threshold, then a treatment with for example the active substances mesosulfuron and iodosulfuron (plus safener) is also performed in the spring. As well as the group of the ALS inhibitors, there is also another substance group, that of the ACCase inhibitors with the so-called FOPS. The nature of the active substance and quantity applied depend on the species of the weed or grassy weed, the number of the plants per $m^2$ or biomass of the weed or grassy weed and the level of the resistance.

Possible examples of application maps are therefore:

the application map is an on/off map dependent on the infestation risk.

the application map is an on/off map dependent on the infestation risk, wherein within an "on" subarea application is performed variably depending on the biomass present.

the application map contains instructions on the variable plant protection agent dosage directly as a function of the infestation risk.

the application map contains instructions on the variable plant protection agent dosage as a function of the biomass, wherein the doses are modified by the infestation risk present.

Here the term "as a function of" usually means that a positive linear relationship exists:

if double the quantity of biomass is present, double the quantity of plant protection agent is applied; if the infestation risk is twice as high, double the quantity of plant protection agent is applied. It is however also possible that a non-linear relationship exists.

In step (E) of the method according to the invention, the treatment of subareas is performed in accordance with the treatment map created in step (D).

Accordingly, in the case of the creation of an application map, one or more selected plant protection agents are applied onto the particular subareas indicated in the application map and the harmful organisms are thus controlled.

It is possible that the preferably digital application map contains commands for an application device for plant protection agents. This means that the digital application map or parts thereof can be loaded into a working memory of an application device, from where the commands are transmitted to a spray device.

An application device is understood to mean a mechanical device for application of a plant protection agent onto a field. Such an application device as a rule comprises at least one container for accommodating at least one plant protection agent, a spray device with which the plant protection agent is discharged on the field and a control device with which the delivery of the at least one plant protection agent from its container in the direction of the spray device is controlled. Accordingly, the digital application map is preferably stored in the working memory of the control unit. In addition, the control unit is preferably connected to a positioning system which determines the position of the application device on the field. The control device preferably sets the application process in motion when it is shown on the digital application map that an application should be effected at a location, and when the positioning system reports that the application device is located at exactly this location. In one embodiment, a person (user) loads the digital application map into a mobile computer system, e.g. a mobile telephone (smartphone), which possesses a GPS receiver. While the user is going across the field, the mobile computer system shows him on the basis of a graphic representation of the field where he is located at the time and at which points he should manually spray (apply) one or more control agents. He then manually sprays at the points at which the application map contains a corresponding instruction. If the user applies a control agent at a place, it is possible that via an appropriate sensing system a notification of the application process performed is transmitted back to the mobile computer system and the application process performed is stored in memory. It is also possible that the application process performed is displayed on the mobile computer system, so that the user can recognize on which points he has already applied. Further, it is possible that the data captured on the mobile computer system is immediately or at a later timepoint transferred to a fixed computer system (e.g. a server) and stored there. In every case, the application performed for each subarea is acquired in the digital application map in a manner such that the number N of the applications (treatments) (still) to be implemented is decreased by one.

It is also possible that a person with a vehicle drives across the field, the position of the vehicle at any time is acquired by a GPS receiver, and on the basis of the digital application map commands are transmitted to a spray device on the vehicle, when the vehicle is located at a location on the field at which according to the application map an application of one or more control agents should take place, whereupon the appropriate application is effected automatically.

It is also possible that the application of one or more control agents is effected fully automatically: an unmanned machine moves with GPS support across the field and applies at the points on the field at which a corresponding application is specified in the digital application map.

In particular, use of the invention in combination with further or conventional application methods is possible. One example is a uniform treatment of the whole field with a first application and a variable application according to this invention in a second application.

Figure 2:
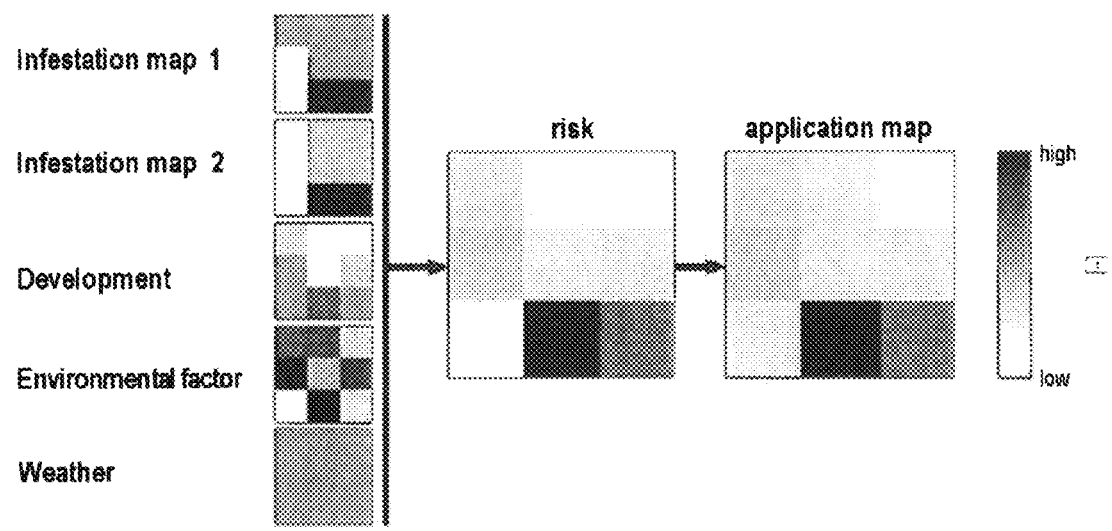
FIG. 2: Schematic illustration of the course of the method according to the invention. In a first step, an infestation risk is estimated from current and historical data, including long-term risk vectors, with the aid of models.

The invention is illustrated schematically on the basis of examples in FIGS. 1 and 2.

FIG. 1: Illustration of selected examples of risk or infestation factors of diseases or pests of various spatial intensity on the field.

A: Uniform risk or infestation;
B; Gradient starting from one side of the field or beyond the field;
C: Gradient starting from one corner of the field or beyond the field;
D: Gradient radial starting from one epicentre;
E: Gradient radial starting from one epicentre with drift;
F: Patch with homogenous risk or infestation;
G: Patch with gradient;
H: Two overlapping patches each with homogeneous risk or infestation.

Further risk or infestation factors are possible (e.g. overlapping gradients of two disease factors, overlapping patches with gradients, multiple point risks, etc.).

FIG. 2: Schematic illustration of the course of the method according to the invention In a first step, an infestation risk is estimated from current and historical data, including long-term risk vectors, with the aid of models.

In a second step, a corresponding application map is created.

In the example, above a risk limit value plant protection agents are applied variably, within a lower risk region a minimal application dose is applied, and below a lower limit value no application is made (white tile in application map). The resolution of the application corresponds to the spatial resolution of the risk factors.

LITERATURE

Hoffmann H, Zhao G, Asseng S, Bindi M, Biernath C, Constantin J, Coucheney E, Dechow R, Doro L, Eckfirst H, Gaiser T, Grosz B, Heinlein F, Kassie B T, Kersebaum K-C, Klein C, Kuhnert M, Lewan E, Moriondo M, Nendel C, Priesack E, Raynal H, Roggero P P, Witter R P, Siebert S, Specka X, Tao F, Teixeira E, Trombi G, Wallach D, Weihermüller L, Yeluripati J, Ewert F. 2016. Impact of spatial soil and climate input data aggregation on regional yield simulations. PLoS ONE 11(4): e0151782, doi: 10.1371/journal.pone.0151782.

Johnen A., Williams I. H., Nilsson C., Klukowski Z., Luik A., Ulber B. 2010. The proPlant Decision Support System: Phenological Models for the Major Pests of Oilseed Rape and Their Key Parasitoids in Europe. In: Biocontrol-Based Integrated Management of Oilseed Rape Pests. Ed.: Ingrid H. Williams. Tartu 51014, Estonia. ISBN 978-90-481-3982-8. p. 381-403.

Knight J. D. 1997. The role of decision support systems in integrated crop protection. Agriculture, Ecosystems and Environment 64, 157-163.

Knight J. D., Mumford J. D. 1994. Decision Support Systems in Crop Protection. Outlook on Agriculture 23, 281-285.

Newe M., Meier H., Johnen A., Volk T. 2003. proPlant expert.com—an online consultation system on crop protection in cereals, rape, potatoes and sugarbeet. EPPO Bulletin 33, 443-449.

Parry H. R., Aurambout J. P., Kriticos D. J. 2011. Having your cake and eating it: A modelling framework to combine process-based population dynamics and dispersal simulation. 19$^{th}$ International Congress on Modelling and Simulation, Perth, Australia, 12-16 Dec. 2011. http://mssanz.org.au/modsim2011. Modsim Proceedins 2535-2541.

Peterson R. K. D, Higley L. G. 2001. Biotic Stress and Yield Loss, CRC Press LLC, 2000 N. W. Corporate Blvd., Boca Raton, Fla. 33431, USA. ISBN 0-8493-1145-4.

Savary S., Stetkiewicz S., Brun F., Willocquet L. 2015. Modelling and mapping potential epidemics of wheat diseases—examples on leaf rust and *Septoria tritici* blotch using EPIWHEAT. Eur J Plant Pathol 142, 771-790.

Wiliocquet L, Aubertot J. N., Lebard S., Robert C., Lannou C., Savary S. 2008. Simulating multiple pest damage in varying winter wheat production situations. Field Crops Research 107, 12-28.

The invention claimed is:

1. A method for the control of harmful organisms in a field in which crop plants are grown, wherein the method comprises the following steps:
   (A) creating a first infestation map, wherein in the first infestation map subareas in the field are indicated in which an infestation with harmful organisms has been observed in a past cultivation period,
   (B) creating a second infestation map, wherein in the second infestation map subareas in the field are indicated in which an infestation with harmful organisms has been observed in a current cultivation period, and
   (C) determining subarea-specific prediction of the infestation risk to the crop plants with harmful organisms for the current cultivation period, wherein the prediction is made based on the first infestation map and/or the second infestation map, and wherein the prediction is further based on subarea-specific information of a state of development of the crop plants, subarea-specific environmental factors, and/or weather information, and
   (D) creating a treatment map, wherein the treatment map indicates which subareas of the field are to be treated in order to prevent the dispersal of the harmful organisms and/or to control harmful organisms, wherein the treatment map is further created based on:
       the prediction of the infestation risk for the current cultivation period, and
       the treatment map is optionally created and/or adapted based on conditions predicted for a time of a planned treatment with regard to: weather, a development state of the crop plant, and/or environmental factors, and
   (E) treating subareas of the field in accordance with the treatment map.

2. The method according to claim 1, wherein in step (B) a first and a second infestation map are created.

3. The method according to claim 1, wherein the subarea-specific prediction of the infestation risk is made based on the following information:
   the first infestation map, and/or
   optionally the second infestation map,
   the subarea-specific information of the state of development of the crop plants or the subarea-specific environmental factors, and
   the weather information.

4. The method according to claim 1, wherein the prediction in step (C) is made by modelling the dispersal of harmful organisms using a rule- or process-based model.

5. The method according to claim 4, wherein the following parameters influence the modelling:
   a) weather,
   b) soil,
   c) crop plant,
   d) cultivation measures,
   e) development state of the crop plant,
   f) current infestation, or
   g) geography.

6. The method according to claim 1, wherein the treatment in step (E) comprises an application of one or more plant protection agents.

7. The method according to claim 1, wherein in the treatment map a treatment is specified for those subareas for which the calculated infestation risk has exceeded a threshold value beyond which a treatment becomes economically useful.

8. The method according to claim 1, wherein in the treatment map for the subareas to be treated a plant protection agent and a quantity and/or concentration of plant protection agent are stated, wherein the quantity and/or concentration is calculated as a function of the biomass present.

9. The method according to claim 1, wherein in the treatment map a plant protection agent and a quantity and/or concentration of plant protection agent are stated for the subareas to be treated, wherein the quantity and/or concentration is calculated as a function of the infestation risk present in each case.

10. The method according to claim 1, wherein in the treatment map a plant protection agent and a quantity and/or concentration of plant protection agent are stated for the subareas to be treated, wherein the quantity and/or concentration is calculated as a function of the infestation risk present in each case and as a function of the infestation risk present in each case.

11. The method of claim 1, further comprising:
   utilizing a treatment map that indicates which subareas of a field for the cultivation of a crop plant are to be treated with a plant protection agent in order to prevent the dispersal of the harmful organisms and/or to control harmful organisms, wherein the treatment map has been created based on a subarea-specific prediction of the infestation risk of the field with one or more harmful organisms for a current cultivation period, and
   optionally, the treatment map has been created and/or adapted based on conditions predicted for a time of the planned treatment with regard to weather, a development state of the crop plant, and/or environmental factors.

12. A system for the control of harmful organisms in a field in which crop plants are grown, comprising
   (A) a first infestation map, wherein in the first infestation map subareas in the field are indicated in which in a past cultivation period an infestation with harmful organisms has been observed,
   (B) a second infestation map, wherein in the second infestation map subareas in the field are indicated in which an infestation with harmful organisms has been observed in the current cultivation period, and
   (C) means for predicting the infestation risk to the crop plants with harmful organisms for the current cultivation period, wherein the prediction is made based on: the first infestation map and/or the second infestation map, the subarea-specific information of a state of development of the crop plants and/or subarea-specific environmental factors, and
weather information, and (D) means for creating a treatment map, wherein the treatment map indicates which subareas of the field are to be treated in order to prevent the dispersal of the harmful organisms and/or to control harmful organisms, wherein the treatment map is created based on:
the prediction of the infestation risk for the current cultivation period, and
the treatment map is further optionally created and/or adapted
based on the conditions predicted for a time of a planned treatment with regard to weather, a development state of the crop plant, and/or environmental factors, and (E) optionally: a means for treating the subareas of the field in accordance with the treatment map.

13. The system of claim 12 further comprising:
a treatment map that indicates which subareas of a field for the cultivation of a crop plant are to be treated with a plant protection agent in order to prevent the dispersal of the harmful organisms and/or to control harmful organisms, wherein the treatment map has been created based on a subarea-specific prediction of the infestation risk of the field with one or more harmful organisms for a current cultivation period, and
optionally, the treatment map has been created and/or adapted based on conditions predicted for a time of the planned treatment with regard to weather, a development state of the crop plant, and/or environmental factors; and
a mobile application device, wherein the mobile application device comprises:
means for applying one or more plant protection agents, a positioning system and a computer, wherein the computer is set up such that the computer can read the treatment map into a working memory of the computer and actuate the means for applying one or more plant protection agents, so that plant protection agent is applied when the mobile application device is located at a location for which location it is stated in the treatment map that plant protection agent is to be applied there.

14. A computer program product comprising:
a computer-readable data storage device,
program code which is stored on the data storage device, and which when run on a computer causes the computer to read one or more digital infestation maps into the working memory of the computer, wherein in the one or more infestation maps, subareas in the field indicate that a past cultivation period with harmful organisms has been observed, and/or an infestation with harmful organisms in a current cultivation period has been observed,
the program code further causing the computer to calculate subarea-specific risks for an infestation of the crop plants with harmful organisms for the current cultivation period, wherein the calculation is made based on the following information:
the digital infestation map(s),
subarea-specific information of a state of development of the crop plants,
subarea-specific environmental factors, and/or
weather information,
the program code further causing the computer to create a digital treatment map and output it in digital form to a user, wherein the treatment map indicates which subareas of the field are to be treated in order to prevent the dispersal of the harmful organisms and/or to control harmful organisms, wherein the treatment map is further created based on a prediction of the subarea-specific infestation risks for the current cultivation period, and
optionally, the treatment map is created and/or adapted based on conditions predicted for a time of a planned treatment of the subareas with regard to: weather, a development state of the crop plant, and/or environmental factors.

15. A treatment map, wherein the treatment map indicates which subareas of a field for the cultivation of a crop plant are to be treated with a plant protection agent in order to prevent the dispersal of the harmful organisms and/or to control harmful organisms, wherein the treatment map has been created based on a subarea-specific prediction of the infestation risk of the field with one or more harmful organisms for a current cultivation period, and optionally, the treatment map has been created and/or adapted based on conditions predicted for a time of the planned treatment with regard to weather, a development state of the crop plant, and/or environmental factors.

* * * * *